(12) United States Patent
Björklund et al.

(10) Patent No.: US 8,305,095 B2
(45) Date of Patent: Nov. 6, 2012

(54) VOLTAGE MEASUREMENTS OF ELECTRICALLY CONDUCTING ELEMENTS IN SYSTEMS FOR CONTROLLING ELECTRICAL PROCESSES

(75) Inventors: Hans Björklund, Ludvika (SE); Krister Nyberg, Smedjebacken (SE)

(73) Assignee: ABB Technology AG, Zürich (CH)

( * ) Notice: Subject to any disclaimer, the term of this patent is extended or adjusted under 35 U.S.C. 154(b) by 337 days.

(21) Appl. No.: 12/663,440

(22) PCT Filed: Jun. 2, 2008

(86) PCT No.: PCT/EP2008/056753
§ 371 (c)(1),
(2), (4) Date: Jun. 14, 2010

(87) PCT Pub. No.: WO2008/148727
PCT Pub. Date: Dec. 11, 2008

(65) Prior Publication Data
US 2010/0244865 A1      Sep. 30, 2010

Related U.S. Application Data

(60) Provisional application No. 60/929,001, filed on Jun. 7, 2007.

(51) Int. Cl.
G01R 27/08 (2006.01)
(52) U.S. Cl. .......................................... 324/713; 324/120
(58) Field of Classification Search .................. 324/120, 324/123 R; 361/78, 62, 115, 58, 93, 91, 361/64, 66
See application file for complete search history.

(56) References Cited

U.S. PATENT DOCUMENTS

| | | | | |
|---|---|---|---|---|
| 3,039,029 A * | 6/1962 | Spafford | | 318/17 |
| 3,114,078 A | 12/1963 | Waldvogel et al. | | |
| 4,523,248 A * | 6/1985 | Schmale et al. | | 361/1 |
| 5,181,026 A * | 1/1993 | Granville | | 340/870.28 |
| 5,737,166 A * | 4/1998 | Hagman | | 361/78 |
| 6,236,949 B1 * | 5/2001 | Hart | | 702/64 |
| 2002/0190705 A1 * | 12/2002 | Skendzic et al. | | 324/127 |
| 2006/0012382 A1 | 1/2006 | Yakymyshyn et al. | | |
| 2006/0290340 A1 * | 12/2006 | Shapiro | | 324/117 H |

FOREIGN PATENT DOCUMENTS

| | | |
|---|---|---|
| CH | 257302 A | 9/1948 |
| FR | 2437626 A | 4/1980 |
| GB | 29501280 U1 | 5/1996 |
| WO | WO 2006/128397 | 12/2006 |

OTHER PUBLICATIONS

PCT/ISA/210—International Search Report—Nov. 3, 2008.
PCT/ISA/237—Written Opinion of the International Searching Authority—Nov. 3, 2008.
PCT/IPEA/409—International Preliminary Report on Patentability—May 4, 2009.

* cited by examiner

Primary Examiner — Arleen M Vazquez
Assistant Examiner — Julio C Diaz Perez
(74) Attorney, Agent, or Firm — Venable LLP; Eric J. Franklin

(57) ABSTRACT

A voltage measurement device for connection to a primary voltage dividing element provided between ground and an electrically conducting element in a system for controlling an electrical process and such a system. The device includes at least one first branch of secondary voltage dividing elements, where the branch is adapted to be connected in parallel with the primary voltage dividing element, and a first measuring unit connected to one of the secondary voltage dividing elements of the first branch and arranged to measure the voltage across this secondary voltage dividing element and provide a first voltage signal corresponding to a voltage of the electrically conducting element.

13 Claims, 3 Drawing Sheets

VOLTAGE MEASUREMENTS OF ELECTRICALLY CONDUCTING ELEMENTS IN SYSTEMS FOR CONTROLLING ELECTRICAL PROCESSES

CROSS-REFERENCE TO RELATED APPLICATIONS

This application claims priority to U.S provisional patent application 60/929,001 filed 7 Jun. 2007 and is the national phase under 35 U.S.C. §371 of PCT/EP2008/056753 filed 2 Jun. 2008.

FIELD OF INVENTION

The present invention relates to a system for controlling an electrical process as well as to a voltage measurement device for provision in such a system.

BACKGROUND

In systems for controlling electrical processes, such as for controlling generation and transmission of electrical power, i.e. high-voltage power transmission and generation systems, it is necessary to measure the voltage at various points in the system, such as for instance in a power line in order to provide control and protection of the system.

In order to provide a reliable system there may be redundancy in relation to the control and protection devices provided. Such a redundancy means that several different parallel protection and control devices may need to receive measurements from the same element in the process.

WO2006/128397 discloses an HVDC system where two separate connections to a power line are provided in order to provide redundancy in relation to measurement results.

However, when the system is a high-voltage system it is often necessary to limit the number of contacts to the system element to as few as possible. There may otherwise be a risk for flashover. This is especially the case in Ultra high HVDC (High Voltage Direct Current) power transmission systems.

One way to solve this problem may be to provide duplicated amplifiers connected to a voltage dividing element. Voltage measurements of a system element, such as a power line may be performed through duplicated amplifiers directly connected to such a primary voltage dividing element. However, with this solution it may not be possible to ensure a high enough reliability. The amplifiers may furthermore not be possible to be replaced during operation.

There is therefore a need for an improvement when measuring voltages of electrically conducting elements in a system for controlling an electrical process.

SUMMARY OF THE INVENTION

The present invention is generally directed towards providing a voltage measurement device, which is easily scalable for enabling the provision of one or more voltage signals relating to the voltage of an electrically conductive system element without having to increase the number of contacts to the system element.

According to the principles of the present invention there is only one voltage measured on the electrically conductive element. This is then divided into an intermediary voltage by a primary voltage dividing element. A single intermediary voltage is then provided to a scalable number of parallel branches with secondary voltage dividing elements, where one secondary voltage dividing element in each branch provides a separate voltage signal.

One object of the present invention is therefore to provide a voltage measurement device for connection to a primary voltage dividing element provided between ground and an electrically conducting element in a system for controlling an electrical process, which device is easily scalable for enabling the provision of one or more voltage signals relating to the voltage of the electrically conducting element.

This object is according to a first aspect of the present invention solved through a voltage measurement device for connection to a primary voltage dividing element provided between ground and an electrically conducting element in a system for controlling an electrical process and comprising at least one first branch of secondary voltage dividing elements, where the branch is adapted to be connected in parallel with the primary voltage dividing element, and a first measuring unit connected to one of the secondary voltage dividing elements of the first branch and arranged to measure the voltage across this secondary voltage dividing element and provide a first voltage signal corresponding to a voltage of the electrically conducting element.

Another object of the present invention is to provide a system for controlling an electrical process including at least one control station, an electrically conducting element, a primary voltage dividing element provided between the electrically conducting element and ground as well as a voltage measurement device, where the voltage measurement device is easily scalable for enabling the provision of one or more voltage signals relating to the voltage of the electrically conducting element.

This object is according to a second aspect of the present invention solved through a system for controlling an electrical process including at least one control station, an electrically conducting element, a primary voltage dividing element provided between the electrically conducting element and ground as well as a voltage measurement device, wherein said voltage measurement device includes
  at least one first branch of secondary voltage dividing elements connected in parallel with the primary voltage dividing element, and
  a first measuring unit connected to one of the secondary voltage dividing elements of the first branch and arranged to measure the voltage across this secondary voltage dividing element and provide a first voltage signal corresponding to a voltage of the electrically conducting element to the control station.

The present invention has a number of advantages. It guarantees that flashovers between various voltage dividing elements are limited. If the secondary voltage dividing elements are passive it is furthermore possible that any temperature deviations between the primary voltage dividing elements and the secondary voltage dividing elements do not influence the measurements. The voltage measurement device is maintenance friendly. It is possible to service and provide maintenance during operation. The device is furthermore scalable so that more or fewer branches can be provided based on need.

BRIEF DESCRIPTION OF THE DRAWINGS

The present invention will in the following be described with reference being made to the accompanying drawings, where
  FIG. 1 schematically shows a power transmission system in which system the principles of the present invention may be applied, FIG. 2 schematically shows a number of primary voltage dividing elements connected between a power line in the system of FIG. 1 and ground, where one primary voltage dividing element is connected to a voltage measurement device according to the invention, FIG. 3 schematically shows a voltage measurement device according to the present invention, and FIG. 4 schematically shows a number of units in a control station being connected to the voltage measurement device of the present invention.

DETAILED DESCRIPTION OF THE INVENTION

In the following, a detailed description of preferred embodiments of a device and a system according to the present invention will be given.

Figure 1:
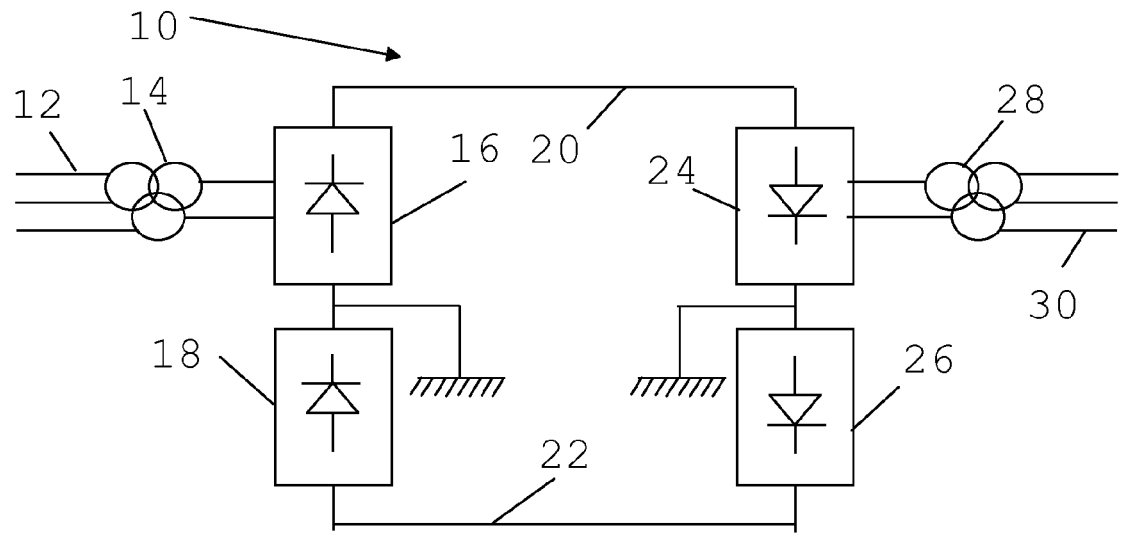

In FIG. 1 there is schematically shown a system for controlling an electrical process. Such processes include processes for controlling generation and transmission of electrical power, i.e. high-voltage (above 50 kV) or ultra high-voltage (above 400 kV) power transmission and generation systems. The system in FIG. 1 is one such system in the form of a high-voltage power transmission system 10. The power transmission system is in the example given in FIG. 1 furthermore a HVDC (High Voltage Direct Current) power transmission system. It should be realized that the present invention is not limited to such a system, but may be used in other types of high-voltage or ultra high-voltage power transmission systems, such as for instance FACTS (Flexible Alternating Current Transmission System).

In the figure there is a first AC power line 12, which is here a three-phase power line, which leads to a first transformer 14. The first transformer 14 is connected to a first converter 16, which converts the AC voltage to a DC voltage. This first converter 16 is in turn connected to a first DC power line 20, which in turn leads to a second converter 24, which is a converter converting DC power to AC power. The second converter 24 is in turn connected to a second transformer 28. The second transformer is in turn connected to a second AC power line 30, which is also here a three-phase power line. The first and second converters 16 and 24 are furthermore connected to ground and there is also each of them connected, at these ground connections, to a corresponding third and fourth converter 18 and 26, which are in turn connected to a second DC power line 22. The third converter 18 is here of the same type as the first converter 16, while the fourth converter 26 is of the same type as the second converter 24. In the system in FIG. 1, the DC power lines 20 and 22 may form a DC link of at least several kilometers length in order to be used to transmit power at reduced losses over a considerable distance. However, it is also possible to use the same configuration to interconnect two AC power lines with for example different AC frequencies at one and the same location.

The system shown in FIG. 1 is a so-called bipole system, where the first DC power line 20 is provided at a first positive voltage and the second DC power line 22 is provided at a second opposite negative voltage. This means that there is a forward current path provided by the first DC power line 20 and a return current path provided by the second DC power line 22. However, it should be realized that it is possible to provide a monopole system instead through removing the return path provided by the second DC power line 22 and removing the third and fourth converters 18 and 26. In a monopole system the first and second converters 16 and 24 would instead only be connected between the first DC power line and ground. In this case a return path may be provided via ground.

Figure 2:
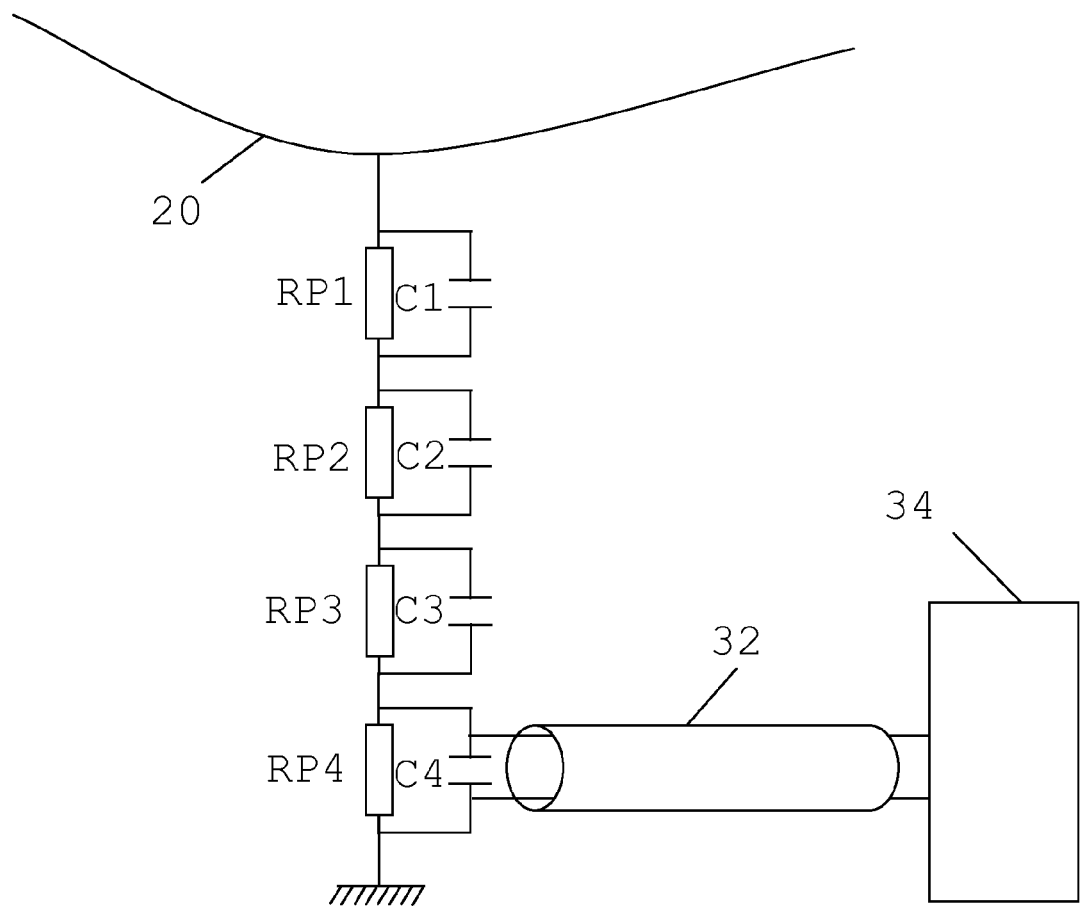

FIG. 2 schematically shows a number of voltage dividing elements being connected to an element of the system in FIG. 1, namely one of the power lines and more particularly the first power line 20. These voltage dividing elements, which according to the invention are primary voltage dividing elements, are here connected in series between the power line and ground. There is in FIG. 1 a first primary voltage dividing element RP1 being connected between the power line 20 and a first end of a second primary voltage dividing element RP2. A second end of the second voltage dividing element RP2 is in turn connected to a first end of a third primary voltage dividing element RP3. There is also a fourth primary voltage dividing element RP4 connected between ground and a second end of the third voltage dividing element RP3. All these voltage dividing elements are provided in the form of resistors, which may with advantage have the same resistance values. There is furthermore a first capacitor C1 connected in parallel with the first voltage dividing element RP1, a second capacitor C2 connected in parallel with the second voltage dividing element RP2, a third capacitor C3 connected in parallel with the third voltage dividing element RP3 and a fourth capacitor C4 connected in parallel with the fourth voltage dividing element RP4. One of the primary voltage dividing elements, here the fourth primary voltage dividing element RP4, is furthermore connected to a voltage measurement device 34 via a cable 32. The cable 32 here includes two conductors, where one is connected to a first end of the fourth voltage dividing element RP4 and the other is connected to a second end of the fourth voltage dividing element RP4. The cable 32 is preferably a shielded cable and then with advantage a double shielded cable. It should here be realized that only four voltage dividing elements are provided in order to simplify the description of the present invention and that in reality many more may be provided in series between power line and ground.

In order to protect and control the system in FIG. 1, there is a need to measure various properties such as currents and voltages of various electrically conducting elements involved in the process. This is done in order to control and protect the system. One such element is of course a power line, such as the first power line. In such protection and control it is thus necessary to measure voltages, such as the voltage of the power line, and provide this measured voltage to control and protection devices, such as control and protection computers. In these systems there is furthermore often a need to provide redundancy regarding protection and control in order to ensure that the system is reliable. This means that several control and protection devices need to receive the same measurement voltages. This would normally mean that also the voltage dividing elements used for obtaining measurement values should be redundant. However, if more than one such voltage dividing element is connected to an electrically conducting system element such as a power line having a high or ultra high voltage level, there is a risk for flashover, since this would normally involve two points of contact to the system element. It would therefore be advantageous if only one primary voltage dividing element is used for such voltage measurements.

There is therefore a need for enabling the provision of measurements to redundant control and protection devices without having to increase the number of measurement points and primary voltage dividing elements connected to an electrically conducting element, such as a power line, in a system for controlling an electrical process.

Now follows a description of a voltage measurement device, which solves this problem.

Figure 3:
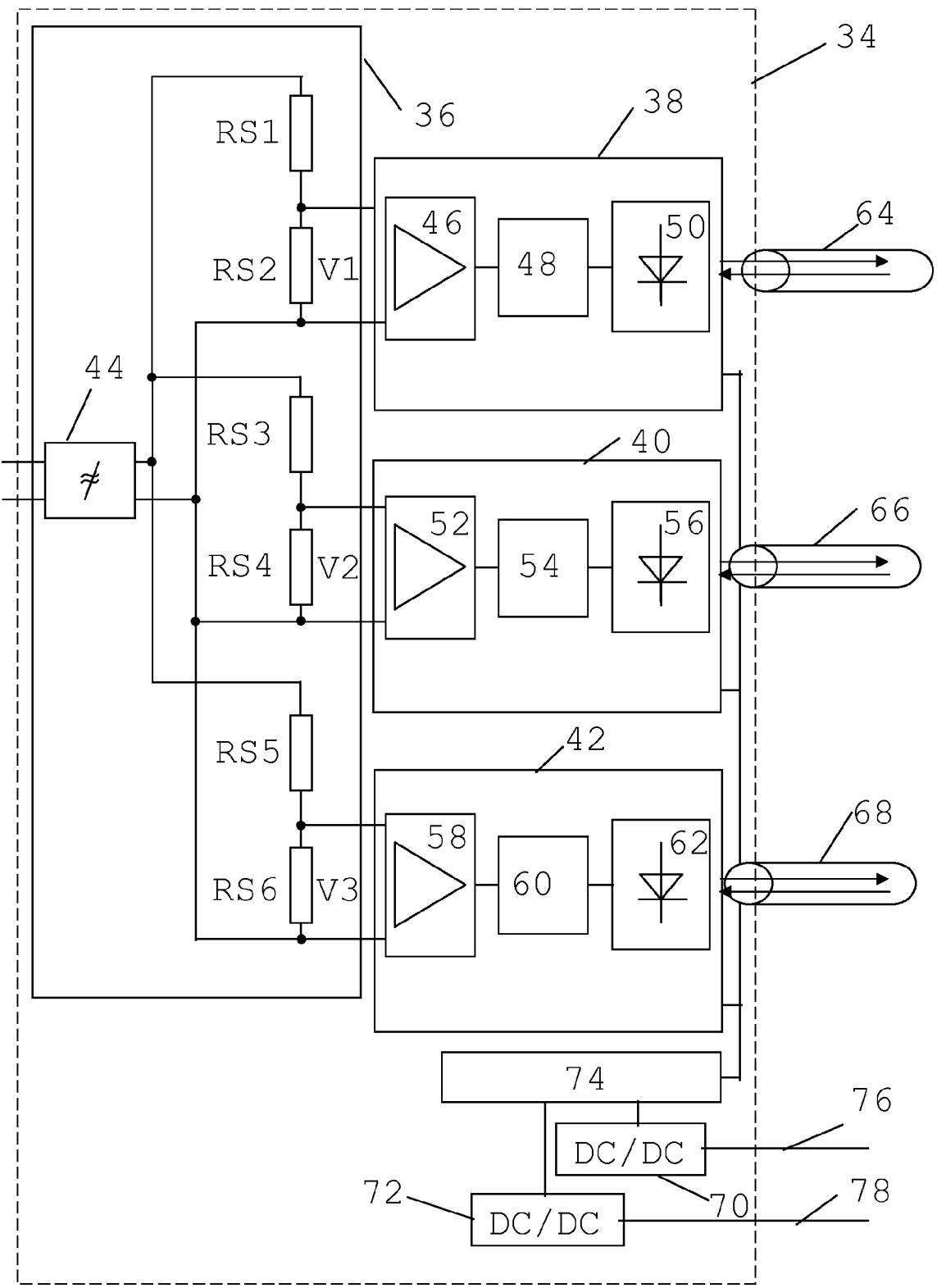

FIG. 3 schematically shows a voltage measurement device 34 according to an embodiment of the present invention. The device 34 includes an interface unit 36 and a first, second and third measuring unit 38, 40 and 42 connected to this interface unit 36. The interface unit 36 includes a filter 44 for connection to the cable in FIG. 2. This filter 44 has two input ports, one input port connected to one of the conductors of the cable and another input port connected to the other conductor of the cable. The filter 44 may be a low-pass filter set to filter out signal components above for instance 20-30 kHz. The filter 44 is furthermore with advantage a passive filter. The filter 44 also has two output ports. In the interface unit there are here provided three branches of secondary voltage dividing elements connected between the output ports of the filter 44. These branches are connected in parallel with each other. In this way the branches are thus also adapted to be connected in parallel with the fourth primary voltage dividing element of FIG. 2. A first branch includes a first secondary voltage dividing element RS1 connected in series with a second secondary voltage dividing element RS2, a second branch includes a third secondary voltage dividing element RS3 connected in series with a fourth secondary voltage dividing element RS4 and a third branch includes a fifth secondary voltage dividing element RS5 connected in series with a sixth secondary voltage dividing element RS6. These secondary voltage dividing elements are here all provided as resistors. Here there may furthermore be a relationship between the first and second secondary voltage dividing element RS1 and RS2 of about 10:1. The same relationship may also be provided between the third and fourth RS3 and RS4 as well as between the fifth and sixth RS5 and RS6 secondary voltage dividing elements. All the secondary voltage dividing elements are here furthermore passive elements, i.e. they do not need to be connected to any power source for their functioning.

The first measuring unit 38 is connected to one of the secondary voltage dividing elements of the first branch, here the second secondary voltage dividing element RS2, and measures the voltage across this secondary voltage dividing element. Through this measuring it furthermore provides a first voltage signal V1 that corresponds to a voltage of the electrically conducting element, i.e. that here corresponds to a voltage of the first power line in FIG. 2. The second measuring unit 40 is here connected to one of the secondary voltage dividing elements of the second branch, here the fourth secondary voltage dividing element RS4. The second measuring unit 40 measures the voltage across this secondary voltage dividing element and provides a second voltage signal V2 corresponding to the same voltage of the first power line. In the same way the third measuring unit 42 is connected to one of the secondary voltage dividing elements of the third branch, here the sixth secondary voltage dividing element RS6, and it measures the voltage across this secondary voltage dividing element and provides a third voltage signal V3. Also this third voltage signal V3 here corresponds to the same voltage of the first power line.

These voltage signals V1, V2 and V3 are then to be transferred to a control station 80 (see FIG. 4) in order to be used in redundant control and protection of the system. In order to do this each measuring unit 38, 40 and 42 may be provided with an amplifier 46, 52 and 58 connected to the corresponding secondary voltage dividing element RS2, RS4 and RS6, which amplifier may be a high-speed high-precision amplifier. Each amplifier 46, 52, 58 may in turn be connected to a logic circuit 48, 54, 60 having A/D conversion means for converting the corresponding voltage signal from an analog to a digital representation, means for possible addressing as well as means for possible error and correction coding. Each logic circuit 48, 54, 60 forwards a number of voltage samples of the voltage measured across the corresponding secondary voltage dividing element in serial form. The error and correction coding means may here be used for notifying a detected failure to the control station 80. Each logic circuit 48, 54, 60 may furthermore be connected to a corresponding electro-optical conversion unit 50, 56 and 62 for converting the corresponding electrical voltage signal from the electrical to the optical domain. These electro-optical conversion units 50, 56 and 62 may be LEDs (light emitting diodes) or lasers. Each measuring unit 38, 40 and 42 is furthermore connected to control and protection units in the control station 80. For this reason each electro-optical conversion unit 50, 56 and 62 is connected to a corresponding optical fiber 64, 66 and 68 leading to the control station 80. In this way each measuring unit 38, 40, 42 provides a measuring channel leading to the control station 80.

As mentioned above the interface unit 36 only includes passive parts and therefore these parts do not need any power. However the parts of the measuring units 38, 40, 42 are normally active. According to one variation of the present invention power for these parts may be supplied by redundant battery systems provided in the control station 80. For this reason there may be a first and a second electrical connection 76 and 78 leading from the control station 80 to the voltage measurement device 34. The voltage measurement device 34 here also includes two DC/DC converters 70 and 72, where one 70 is connected to one electrical connection 76 and the other 72 is connected to the other electrical connection 78. These two converters 70 and 72 may in turn be connected to a diode circuit 74, which in turn is connected to each measuring unit 38, 40 and 42. The diode circuit 74 is here arranged to always supply power to the measuring units 38, 40 and 42 if one or both of the electrical connections 76 and 78 provide electrical power.

Figure 4:
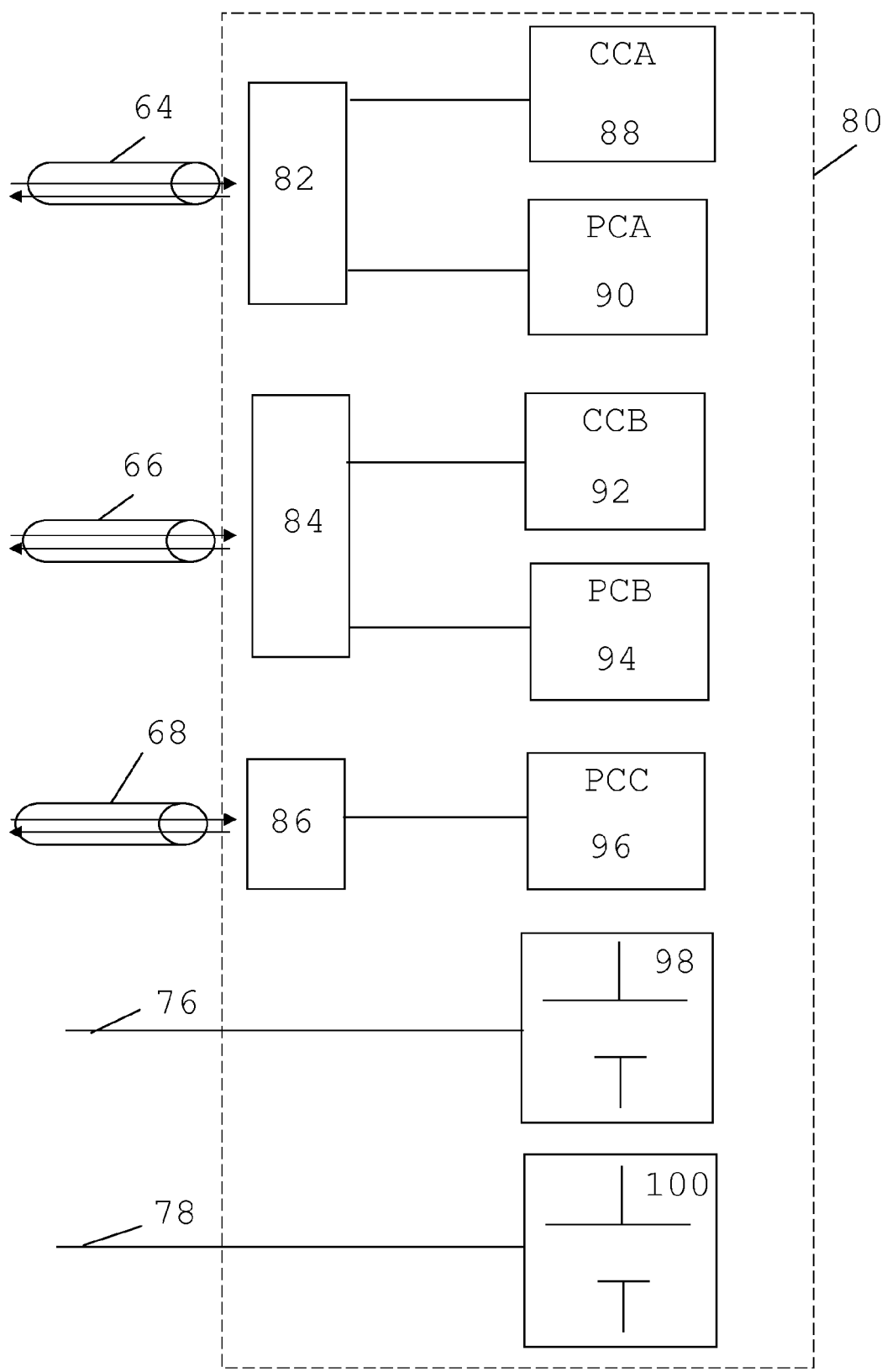

FIG. 4 does finally schematically show some units in the control station 80, which units are used according to the present invention for controlling and protection in the system. The control station 80 thus includes control and protection equipment. The optical fiber 64 leaving the first measuring unit 38 here leads to a first interface unit 82, which includes means for converting the first voltage signal, which is received in serial form, from the optical to the electrical domain and for transferring the converted signal to a first control device that is here a first control computer CCA 88 and to a first protection device that is here a first protection computer PCA 90. The optical fiber 66 leaving the second measuring unit 40 here leads to a second interface unit 84, which includes means for converting the second voltage signal from the optical to the electrical domain and for transferring the converted signal to a second control device that is here a second control computer CCB 92 and to a second protection device that is here a second protection computer PCB 94. The optical fiber 68 leaving the third measuring unit 42 here leads to a third interface unit 86, which includes means for converting the third voltage signal from the optical to the electrical domain and for transferring the converted signal to a third protection device that is here a third protection computer PCC 96. There is finally a first battery system 98 connected to the first electrical connection 76 and a second battery system 100 connected to the second electrical connection 78 for supplying power to the measuring units 38, 40 and 42 of the voltage measurement device 34. These battery systems 98 and 100 typically supply DC power at 120 V while the DC/DC converters convert this to DC supply power at 24 V.

The reason for having two control computers is for redundancy. The reason for having three protection computers is here in order to have so-called two-out-of-three operation. This means that a certain protective action is performed if it is decided by a majority of the protection computers.

The voltage measurement device according to the present invention can with advantage be provided in proximity of the primary voltage dividing element and thus also be separated from or provided at a distance from the control station. In order to facilitate maintenance during operation it is however advantageous if it is provided outside of security fences that may be provided on each side of such power lines.

According to the present invention there is only one voltage measured on the power line. This is then divided into an intermediary voltage by the fourth primary voltage dividing element. This single intermediary voltage is then provided to the three branches, from where three voltage signals are obtained that are separately provided to the control station. In this way it is guaranteed that flashovers between various voltage dividing elements are limited.

Through providing separate branches that are provided in parallel with the primary voltage dividing element, there is furthermore a redundancy provided. This means that if one channel becomes erroneous, the other two can still provide measurements, which increases the reliability. Through having passive elements in the interface unit of the voltage measurement device it is furthermore possible that any temperature deviations between the primary voltage dividing elements and the secondary voltage dividing elements do not influence the measurements. This may require that the primary voltage dividing elements are equally sized and that the current running in the branches is not too high. The security of the voltage measurement device is thus very high. This voltage measurement device is also maintenance friendly. It is possible to service and provide maintenance during operation of the voltage measurement device. The voltage measurement device is also scalable so that more or fewer branches can be provided based on how many are needed. The use of optical fibers have the further advantage of providing a high immunity to EMI (electromagnetic interference), the risk for EMC (electromagnetic compatibility) problems is thus reduced, which may especially be the case for long cables passing through high voltage switch gear. EMC can be problematic when the requirement is high on fast transient responses of measured voltages.

It is possible to add a few features to the described invention. It is possible to provide means for determining an outdoor temperature and a temperature within the voltage measurement device, and then more particularly in the interface unit, and means for adjusting the voltage measurement values based on this difference. This may provide a higher precision on the measurement values.

It is also possible to provide inputs on each measuring channel for detection of low gas pressure in the voltage measurement device. This may be used to generate an alarm for stopping power transfer, since the voltage measurement device may not be able to handle a high voltage when the gas pressure is sinking.

The part of the logic circuit of each measuring unit that provides error and protection coding, for instance CRC coding, can be seen as means for internal supervision and detection of failures on the corresponding measuring channel and means for notifying a detected failure to the control station. An incorrect code may then generate an alarm and this alarm may be used for switching between control computers. One control computer may here be an active control computer and the other control computer may be a control computer in hot standby. This means that the standby computer performs all the functions of an active computer. However any commands that it generates are not used in controlling the system, they are inactivated. As soon as a standby computer becomes an active computer these commands are activated. This enables a quick change from standby to active of the computer in question, which is often necessary in closed-loop control. The above-mentioned alarm generated based on incorrect error and protection codes can therefore be used for rapidly switching between an active and a standby control computer. For a protection computer, the corresponding protective system may be turned off based on an alarm. In case the protection computers are operating according to the two-out-of-three scheme, this means that an alarm can cause the protection computers to switch over to a normal redundant operation.

There are a number of further modifications that can be made to the present invention apart from those already mentioned. The invention can be applied to other electrically conducting elements than power lines, like for instance circuit breakers. The filter in the interface unit may be omitted. Each branch may include more secondary voltage dividing elements than two as long as one is used for obtaining voltage signals. The number of branches may furthermore be varied. The voltage measurement device may for instance include only one branch, two branches or even more than three branches all depending on how many voltage signals from the same measurement point of the electrically conducting element that are needed. Naturally there are then only as many measuring units as there are branches. In the measuring units it is possible to omit the amplifier, the logic circuit and also the electro-optical conversion unit. The voltage measurement device was furthermore above described as being connected to the fourth primary voltage dividing element, which was the element being located furthest form the electrically conducting element and thus closest to ground. This is advantageous from a safety and accessibility point of view. It should however be realized that the voltage measurement device may be connected to any of the primary voltage dividing elements. The DC/DC converters may furthermore be provided in the control station as may the diode circuit.

From the foregoing discussion it is evident that the present invention can be varied in a multitude of ways. It shall consequently be realized that the present invention is only to be limited by the following claims.

The invention claimed is:

1. A voltage measurement device for connection to a primary voltage dividing element provided between ground and an electrically conducting element in a system for controlling an electrical process, the voltage measurement device comprising:
   a first branch of secondary voltage dividing elements including two or more voltage dividing elements, wherein said first branch is adapted to be connected in parallel with said primary voltage dividing element;
   a first measuring unit connected to one of the secondary voltage dividing elements of the first branch and arranged to measure a voltage across the one of the secondary voltage dividing elements and provide a first voltage signal corresponding to a voltage of the electrically conducting element;
   a second branch of secondary voltage dividing elements including two or more voltage dividing elements, wherein said second branch is connected in parallel with said first branch; and a second measuring unit connected to one of the secondary voltage dividing elements of the second branch and arranged to measure a voltage across the one of the secondary voltage dividing elements and provide a second voltage signal corresponding to the voltage of the electrically conducting element.

2. The voltage measurement device according to claim 1, further comprising:
an electro-optical conversion unit in each measuring unit, each electro-optical conversion unit being configured to convert the corresponding voltage signal from an electrical to an optical domain in order to be transmitted to a control station of the system.

3. The voltage measurement device according to claim 1, further comprising:
an A/D converter in each measuring unit, each A/D converter configured to convert the corresponding voltage signal from an analog to a digital representation.

4. The voltage measurement device according to claim 1, further comprising:
an amplifier in each measuring unit.

5. The voltage measurement device according to claim 1, further comprising:
a filter arranged between each branch and the primary voltage dividing element.

6. The voltage measurement device according to claim 1, further comprising:
a temperature determining module configured to determine an outdoor temperature and a temperature within the voltage measurement device; and
a voltage adjustment module configured to adjust voltage measurement values.

7. The voltage measurement device according to claim 1, wherein each measuring unit comprises a measuring channel to a control station of the system.

8. The voltage measurement device according to claim 7, further comprising:
inputs on each measuring channel for detection of low gas pressure.

9. The voltage measurement device according to claim 7, further comprising:
an internal supervision and detection module configured to supervise and detect failures on each measuring channel; and
a notification module configured to generate and send a notification of a detected failure to the control station.

10. The voltage measurement device according to claim 1, further comprising:
a power receiver configured to redundantly receive power from redundant battery systems in the system.

11. A system for controlling an electrical process, the system comprising:
at least one control station;
an electrically conducting element;
a primary voltage dividing element provided between the electrically conducting element and ground;
a voltage measurement device comprising at least one first branch of secondary voltage dividing elements including two or more voltage dividing elements, wherein said first branch is connected in parallel with said primary voltage dividing element;
a first measuring unit connected to one of the secondary voltage dividing elements of the first branch and arranged to measure the voltage across this secondary voltage dividing element and provide a first voltage signal corresponding to a voltage of the electrically conducting element to said control station;
a second branch of secondary voltage dividing elements including two or more voltage dividing elements and connected in parallel with said first branch; and
a second measuring unit connected to one of the secondary voltage dividing elements of the second branch and arranged to measure the voltage across this secondary voltage dividing element and provide a second voltage signal corresponding to the same voltage of the electrically conducting element.

12. The system according to claim 11, wherein said control station comprises control and protection devices configured to receive the first voltage signal.

13. The system according to claim 11, wherein said voltage measurement device is separated from the control station.

* * * * *